US012635443B2

(12) United States Patent (10) Patent No.: US 12,635,443 B2
Komori et al. (45) Date of Patent: May 19, 2026

(54) PRESSURE ADJUSTING VALVE AND SEMICONDUCTOR MANUFACTURING APPARATUS

(71) Applicant: Tokyo Electron Limited, Tokyo (JP)

(72) Inventors: Eiichi Komori, Aichi (JP); Tsuneyuki Okabe, Aichi (JP)

(73) Assignee: Tokyo Electron Limited, Tokyo (JP)

( * ) Notice: Subject to any disclaimer, the term of this patent is extended or adjusted under 35 U.S.C. 154(b) by 537 days.

(21) Appl. No.: 18/152,986

(22) Filed: Jan. 11, 2023

(65) Prior Publication Data

US 2023/0238255 A1 Jul. 27, 2023

(30) Foreign Application Priority Data

Jan. 25, 2022 (JP) ................................. 2022-009520

(51) Int. Cl.
H10P 72/00 (2026.01)
C23C 16/44 (2006.01)
C23C 16/52 (2006.01)
H01J 37/32 (2006.01)

(52) U.S. Cl.
CPC ...... H10P 72/0402 (2026.01); C23C 16/4412 (2013.01); C23C 16/52 (2013.01); H01J 37/3244 (2013.01); H01J 37/32449 (2013.01)

(58) Field of Classification Search
CPC .......... H01L 21/67017; C23C 16/4412; C23C 16/52; C23C 16/34; C23C 16/45557; F16K 17/02; F16K 25/02; F16K 51/02; H01J 37/3244; H01J 37/32449; H01P 72/0402

USPC ...................................................... 204/298.07
See application file for complete search history.

(56) References Cited

U.S. PATENT DOCUMENTS 5,542,559 A * 8/1996 Kawakami .......... H01J 37/3244
156/345.47
5,795,399 A * 8/1998 Hasegawa ............... C23C 16/56
156/345.31

FOREIGN PATENT DOCUMENTS

| JP | H03-004073 | 1/1991 |
| JP | H07-332541 | 12/1995 |
| JP | 2000074228 A * | 3/2000 |
| JP | 2005-026516 | 1/2005 |
| JP | 2005-299869 | 10/2005 |
| JP | 2013-007383 | 1/2013 |

OTHER PUBLICATIONS

Machine Translation JP 2000-074228 (Year: 2000).*

* cited by examiner

*Primary Examiner* — Rodney G Mcdonald
(74) *Attorney, Agent, or Firm* — IPUSA, PLLC

(57) ABSTRACT

A pressure adjusting valve includes a pipe, a valve body arranged inside the pipe, and a support shaft configured to rotatably support the valve body. The pressure adjusting valve is configured to adjust pressure by rotating the valve body. The valve body has, inside the valve body, a valve body side flow path through which a purge gas can flow, and has a plurality of outlets that communicate with the valve body side flow path at an outer periphery of the valve body. The support shaft has a support shaft side flow path for introducing the purge gas into the valve body side flow path.

10 Claims, 8 Drawing Sheets

PRESSURE ADJUSTING VALVE AND SEMICONDUCTOR MANUFACTURING APPARATUS

CROSS-REFERENCE TO RELATED APPLICATIONS

This patent application is based on and claims priority to Japanese Patent Application No. 2022-009520 filed on Jan. 25, 2022, the entire contents of which are incorporated herein by reference.

TECHNICAL FIELD

The present disclosure relates to a pressure adjusting valve and a semiconductor manufacturing apparatus.

BACKGROUND

In a semiconductor manufacturing apparatus, when a substrate is processed with a reactive gas in a processing chamber, by-products that do not contribute to the processing are generated. Such by-products are deposited on an exhaust pipe that exhausts a gas in the processing chamber, a pressure adjusting valve in the exhaust pipe, and the like. Thus, for example, Patent Document 1 discloses a technique to suppress the attachment of by-products by providing a heater in the exhaust pipe and adjusting the temperature of the exhaust pipe.

RELATED ART DOCUMENT

Patent Document

[Patent Document 1] Japanese Laid-open Patent Application Publication No. 2005-26516

SUMMARY

According to one aspect of the present disclosure, a pressure adjusting valve includes a pipe, a valve body arranged inside the pipe, and a support shaft configured to rotatably support the valve body. The pressure adjusting valve is configured to adjust pressure by rotating the valve body. The valve body has, inside the valve body, a valve body side flow path through which a purge gas can flow, and has a plurality of outlets that communicate with the valve body side flow path at an outer periphery of the valve body. The support shaft has a support shaft side flow path for introducing the purge gas into the valve body side flow path.

DETAILED DESCRIPTION OF EMBODIMENTS

In the following, embodiments of the present disclosure will be described with reference to the drawings. In each drawing, the same components are referenced by the same symbols, and duplicate description may be omitted.

Figure 1:
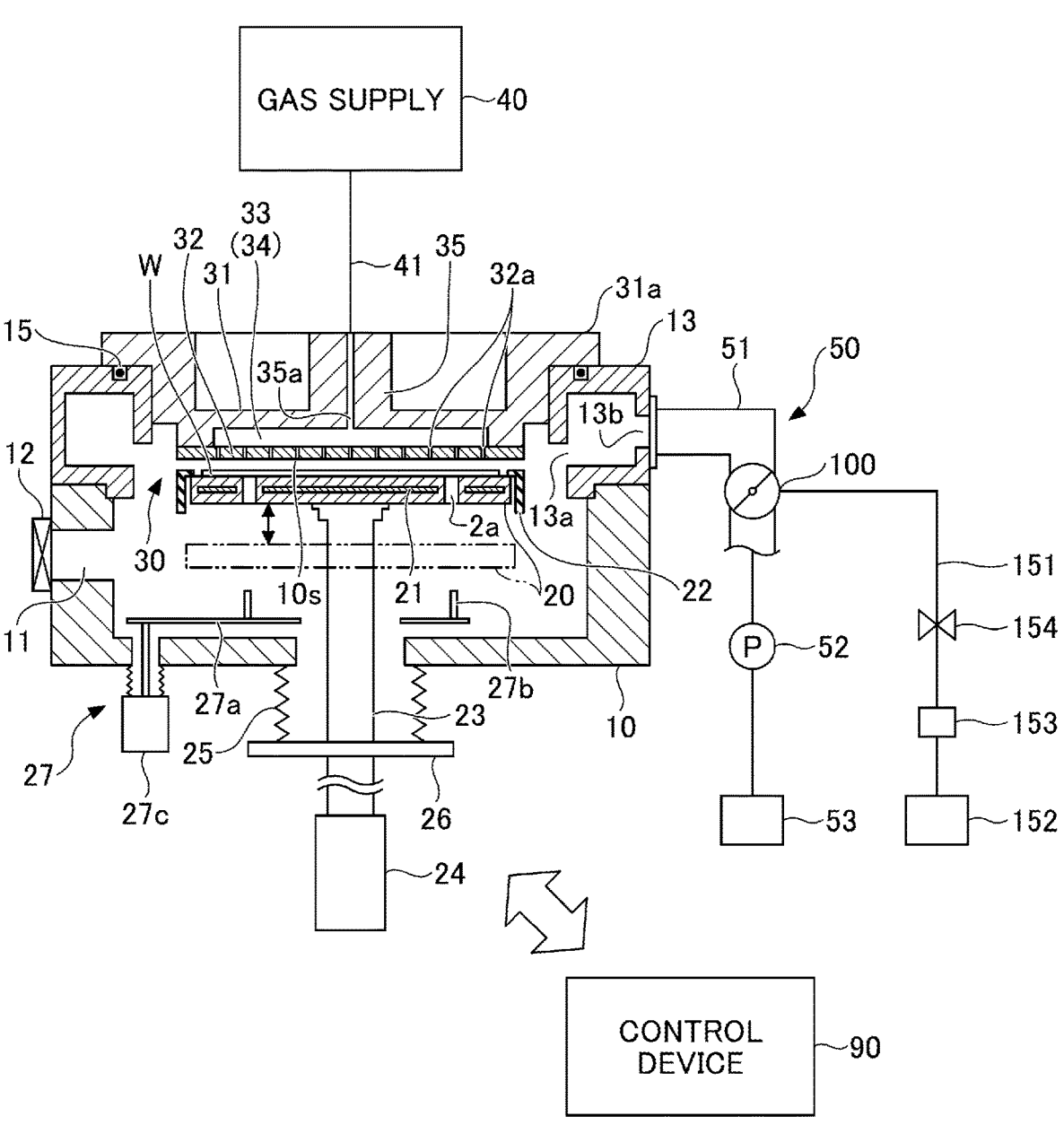
FIG. 1 is a sectional side view schematically illustrating a semiconductor manufacturing apparatus according to an embodiment.

As illustrated in FIG. 1, a pressure adjusting valve 100 according to one embodiment is applied to a semiconductor manufacturing apparatus 1 that manufactures semiconductors. In the following, for easier understanding of the disclosure, a configuration of the semiconductor manufacturing apparatus 1 will be described first.

[Configuration of the Semiconductor Manufacturing Apparatus 1]

The semiconductor manufacturing apparatus 1 according to the embodiment is a film deposition apparatus in which a metal nitride film such as a titanium nitride (TiN) film or a titanium oxynitride (TiON) film is formed on a surface of a substrate W by atomic layer deposition (ALD). A semiconductor substrate such as a silicon wafer or a compound semiconductor wafer can be considered as the substrate W on which the film deposition process is performed. Here, the film deposition apparatus may be an apparatus in which a film other than a metal nitride film (for example, high dielectric film (a high-k film)) is formed on the substrate W.

Specifically, the semiconductor manufacturing apparatus 1 includes a processing chamber 10 in which the substrate W is processed. Additionally, the semiconductor manufacturing apparatus 1 includes a susceptor 20, a showerhead 30, a gas supply 40, and an exhaust section 50, as components installed in or connected to the processing chamber 10. Furthermore, the semiconductor manufacturing apparatus 1 includes a control device 90 configured to control each component to perform the film deposition process.

The processing chamber 10 is made of a metal such as aluminum and has a processing space 10s inside in which the film deposition process is performed on the substrate W. The processing chamber 10 is formed in a substantially cylindrical shape in accordance with a planar shape of the substrate W to be accommodated. Additionally, the processing chamber 10 includes a carry-in/out port 11 for carrying in and out the substrate W and a gate valve 12 for opening and closing the carry-in/out port 11.

Further, the processing chamber 10 has an exhaust duct 13, having an annular shape, at the top. The exhaust duct 13 has a slit 13a communicating with the processing space 10s along the circumferential direction of the inner circumferential surface and has an exhaust port 13b at a predetermined position on the outer circumferential surface.

The susceptor 20 is made of nickel or the like and is supported by a support member 23 in the processing chamber 10. The susceptor 20 is formed in a planar shape corresponding to the substrate W (a precise circle shape), and supports the substrate W horizontally. Additionally, the susceptor 20 includes a heater 21 inside that heats the substrate W mounted on a mounting surface (an upper surface) of the susceptor 20. The temperature of the mounting surface of the susceptor 20 is controlled to, for example, 300° C. to 450° C. by the heater 21. Additionally, the susceptor 20 includes a cover member 22 made of ceramics such as alumina so as to cover the outer periphery region of the mounting surface of the substrate W and the side surface of the susceptor 20.

The support member 23 that supports the susceptor 20 passes through a hole formed in the bottom wall of the processing chamber 10 and extends from the center of the bottom of the susceptor 20 to the lower side of the processing chamber 10, and the lower end of the support member 23 is connected to an up-and-down moving mechanism 24. The susceptor 20 is raised and lowered by the up-and-down moving mechanism 24 through the support member 23. Specifically, the up-and-down moving mechanism 24 displaces the susceptor 20 between a processing position where the film deposition process is performed on the substrate W and a transfer position where the substrate W can be transferred below the processing position. Additionally, below the processing chamber 10 in the vertical direction, a bellows 25 that expands and contracts with the susceptor 20 lifting and lowering and a flange 26 that closes the lower end of the bellows 25 are provided.

The processing chamber 10 has a substrate lifter 27 in the bottom wall. The substrate lifter 27 includes a lifting plate 27a, multiple (for example, three) support pins 27b projecting upward from the lifting plate 27a, and a pin up-and-down moving mechanism 27c that raises and lowers the lifting plate 27a. When the substrate W is carried into the processing chamber 10, the substrate lifter 27 receives the substrate W by raising the support pins 27b with respect to the substrate W carried by a transfer arm (which is not illustrated), and then by lowering the support pins 27b, the substrate W is mounted on the susceptor 20 disposed at the processing position. Conversely, when the substrate W is carried out from the processing chamber 10, the substrate lifter 27 raises the substrate W from the susceptor 20 disposed at the processing position by raising the support pins 27b, and transfers the substrate W to the inserted transfer arm.

A showerhead 30 is made of aluminum, for example, and is provided so as to face the susceptor 20 on the upper side of the processing chamber 10 in the vertical direction. The showerhead 30 has a body 31 and a shower plate 32.

The body 31 is formed in a substantially cylindrical shape and has a recess 34 in the center on the lower side in the vertical direction, which forms a gas diffusion space 33. On the upper side of an outer edge of the body 31, a flange 31a that projects outward in the radial direction and engages the exhaust duct 13 is provided. A sealing member 15 is used to airtightly seal between the flange 31a and the exhaust duct 13. Additionally, the body 31 has a gas introduction section 35 projecting upward in the vertical direction at the center on the upper side. The gas introduction section 35 has a gas flow path 35a connecting to the gas diffusion space 33.

The shower plate 32 is attached to cover the recess 34 on the lower side of the body 31 in the vertical direction. The recess 34 and the shower plate 32 define the gas diffusion space 33. The shower plate 32 has multiple gas discharge holes 32a for discharging a gas from the gas diffusion space 33.

The gas supply 40 has a gas supply path 41 connected to the gas flow path 35a of the body 31, and includes a gas source for multiple types of processing gases (a raw gas source, a reducing gas source, and the like), which is not illustrated in the drawings, on the upstream side of the gas supply path 41. The raw gas supplied by the gas supply 40 is not particularly limited as long as the raw gas can form a film in the film deposition process, and may be an organic or inorganic compound. When a TiN film is formed, for example, titanium chloride ($TiCl_4$) or the like can be used as the raw gas. Additionally, when the TiN film is formed, a nitrogen-containing gas such as ammonia ($NH_3$) can be used as the reducing gas supplied by the gas supply 40. Here, the gas supply 40 may be configured such that a purge gas source or the like for supplying a purge gas is connected to the gas supply path 41. Although a single gas supply path 41 is illustrated in FIG. 1, the gas supply path 41 may be provided for each of multiple types of processing gases.

Further, the gas supply 40 includes a flow rate controller such as a mass flow controller and an opening/closing valve (both are not illustrated) in each of the gas supply paths 41 between the raw gas source and the body 31 and between the reducing gas source and the body 31. The semiconductor manufacturing apparatus 1 controls the flow rate controller and the opening/closing valve at the control device 90 to switch the flow and stop of the raw gas and the reducing gas, and to adjust the flow rate of the raw gas.

The exhaust section 50 has an exhaust path 51 connected to the exhaust port 13b of the exhaust duct 13 of the processing chamber 10. Then, the exhaust section 50 includes a pressure adjusting valve (an automatic pressure control (APC) valve) 100 configured to adjust the pressure inside the processing chamber 10, at a position in the middle of the exhaust path 51. Additionally, the exhaust section 50 includes a vacuum pump 52 and a dispose section 53 for processing the exhaust gas on the downstream side from the pressure adjusting valve 100 in the exhaust path 51. The exhaust section 50 exhausts the gas in the processing chamber 10 to the dispose section 53 through the exhaust duct 13 and the exhaust path 51 by operating the vacuum pump 52 to suction the gas in the processing chamber 10 during the film deposition process. Additionally, the semiconductor manufacturing apparatus 1 can adjust the pressure in the processing chamber 10 by adjusting the opening degree of the pressure adjusting valve 100 when the gas is suctioned by the vacuum pump 52.

The control device 90 of the semiconductor manufacturing apparatus 1 controls the susceptor 20, the gas supply 40, the exhaust section 50, and the like described above, to perform the film deposition process in the processing chamber 10. The control device 90 is a computer for controlling that includes one or more processors, a memory, an input/output interface and an electronic circuit, which are not illustrated. The one or more processors are a combination of one or more of a CPU, a GPU, an ASIC, an FPGA, a circuit formed of multiple discrete semiconductors, and the like. The memory includes a nonvolatile memory and a volatile memory and forms a storage unit of the control device 90. A program for controlling the film deposition process and a recipe performed in the film deposition process are stored in the memory. The processor reads the program and recipe from the memory to control the film deposition process.

[Configuration of the Pressure Adjusting Valve 100]

Figure 2A:
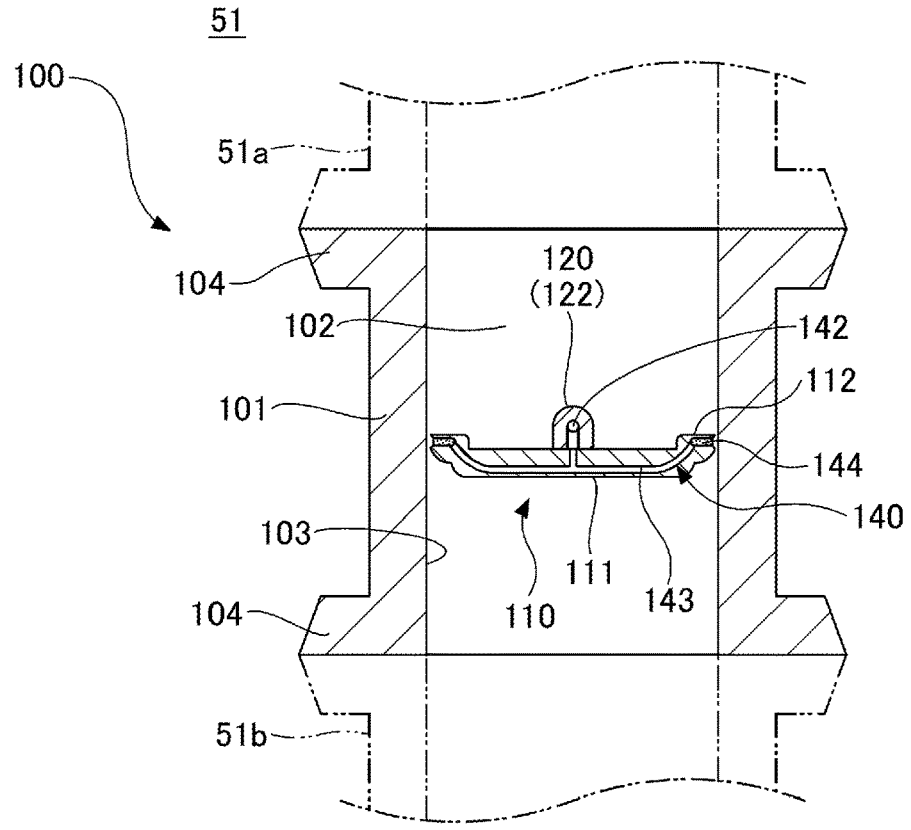
FIG. 2A is a sectional side view schematically illustrating a pressure adjusting valve.
Figure 2B:
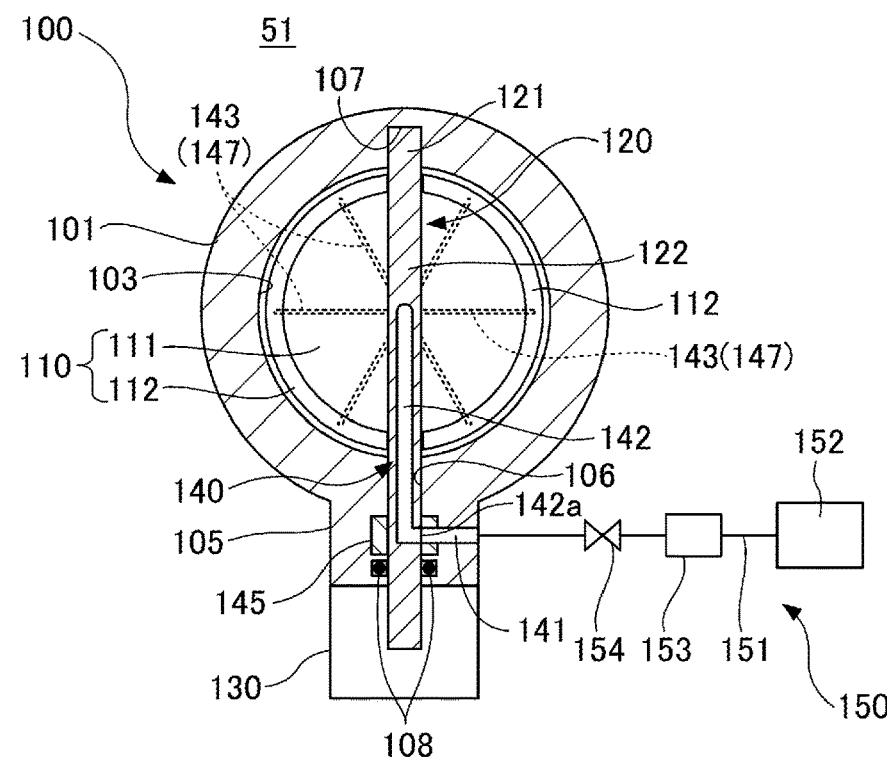
FIG. 2B is a sectional plan view schematically illustrating the pressure adjusting valve.

Next, a configuration of the pressure adjusting valve 100 of the exhaust section 50 will be described. As illustrated in FIG. 2A and FIG. 2B, the pressure adjusting valve 100 includes a pipe 101 connected to an upstream side pipe 51a and a downstream side pipe 51b constituting the exhaust path 51, a valve body 110 disposed in the pipe 101, and a support shaft 120 rotatably supporting the valve body 110. Additionally, the pressure adjusting valve 100 includes a valve body operating section 130 configured to adjust the rotation angle of the valve body 110 outside the pipe 101.

The pipe 101 is formed in a cylindrical shape and has a through-hole 102 that forms the flow path of the exhaust path 51 inside. An inner circumferential surface 103 of the pipe 101 is formed in a precise circle in a cross section perpendicular to the axial direction of the pipe 101. The length of the pipe 101 in the axial direction is not particularly limited, but is set to, for example, the diameter of the valve body 110 or greater. Additionally, the pipe 101 includes a flange 104 at each of the ends in the axial direction. Respective flanges 104 are connected to the flanges of the upstream side pipe 51a and the flanges of the downstream side pipe 51b by fixing means such as screwing.

The pipe 101 has a projection 105 projecting outward in the radial direction on a portion of the outer circumferential surface. The projection 105 forms a part that holds the valve body operating section 130. A shaft hole 106 that accommodates the support shaft 120 is formed in the projection 105 and a portion of the pipe 101 from which the projection 105 continues. Additionally, a hole 107 that accommodates the support shaft 120 is formed at a portion opposite to the shaft hole 106 in the pipe 101 (a portion where a phase is shifted by 180 degrees with respect to the shaft hole 106 in the inner circumferential surface 103 of the pipe 101).

Figure 3:
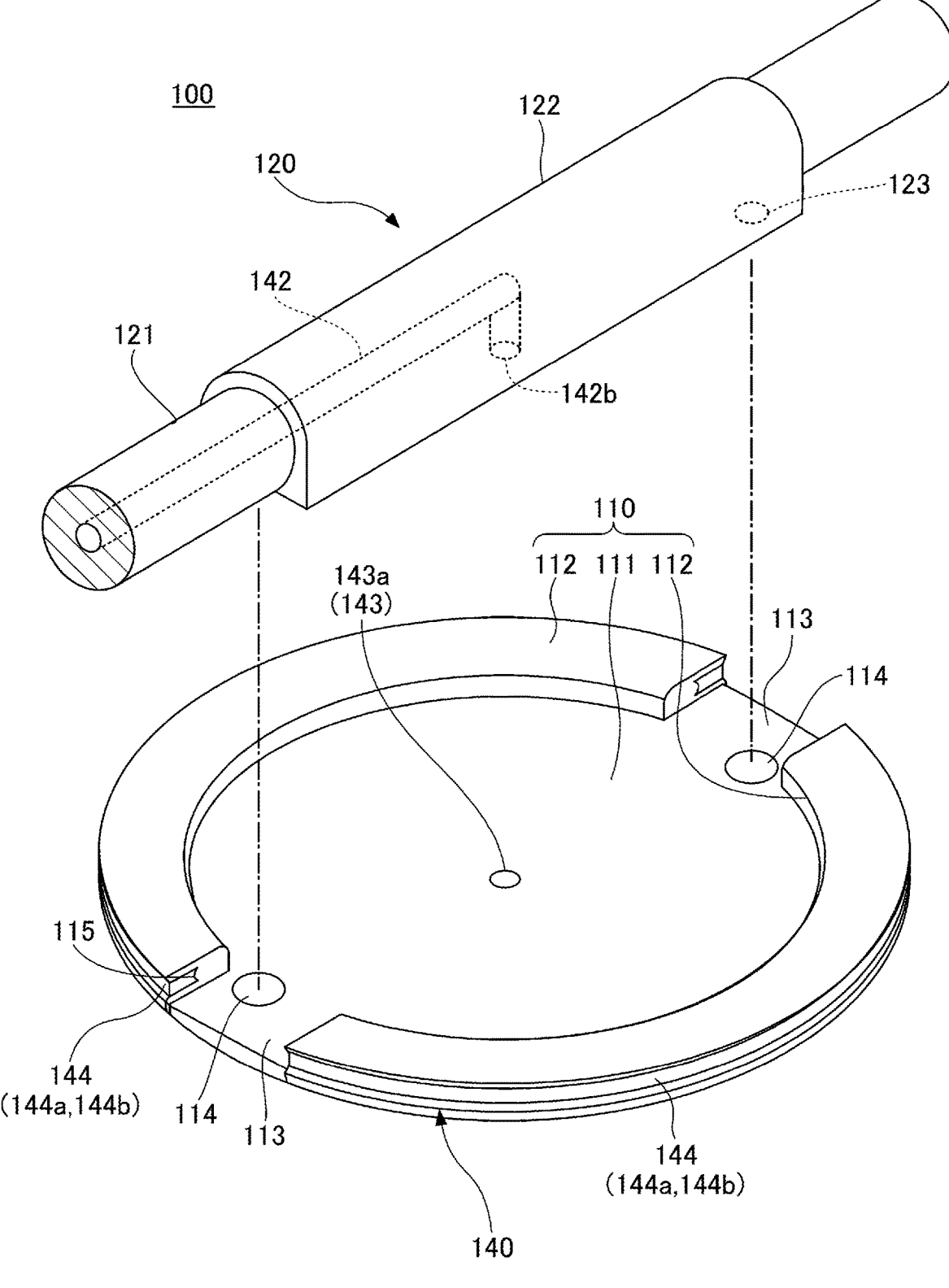
FIG. 3 is an exploded perspective view illustrating a valve body and a support shaft of the pressure adjusting valve.

The valve body 110 is formed in a disk shape having a diameter slightly smaller than the diameter of the through-hole 102 of the pipe 101. Therefore, the valve body 110 is disposed in non-contact with the inner circumferential surface 103 while being accommodated in the through-hole 102 of the pipe 101. As illustrated in FIG. 2A to FIG. 3, the valve body 110 has a base 111 fixed to the support shaft 120 and a pair of outer projections 112 projecting to a low height from a primary surface (an upper surface) on the outer periphery of the base 111.

The base 111 is formed in a circular plate in which the flat upper surface and a secondary surface (a lower surface) extend parallel to each other. The thickness of the base 111 is not particularly limited, but is set to, for example, several mm to several tens of mm.

Each of the pair of outer projections 112 forms a circular arc extending approximately 180 degrees along the outer periphery of the base 111 in the circumferential direction. The pair of outer projections 112 project, on the outer sides, slightly more outward in the radial direction than the outer periphery of the base 111, and form an outer edge in the valve body 110. In the outer periphery of the base 111, portions where the pair of outer projections 112 are separated from each other form cut-outs 113 for positioning the support shaft 120.

The pressure adjusting valve 100 rotatably supports the valve body 110 by fixing the support shaft 120 to the upper surface of the valve body 110 with the support shaft 120 being pivotally supported by the pipe 101. To fix the valve body 110 and the support shaft 120, the base 111 has a fixing hole 114 penetrating the upper and lower surfaces at the positions of two cut-outs 113 formed between the pair of outer projections 112. The pressure adjusting valve 100 integrates the valve body 110 and the support shaft 120 by screwing a screw, which is not illustrated, into the support shaft 120 from the lower side of the base 111 through each fixing hole 114.

The support shaft 120 is a member having a rod shape extending in a straight line and rotatably supports the valve body 110 in the pipe 101. The support shaft 120 has a shaft body 121 that is formed in a precise circle in a cross-section view perpendicular to the axial direction of the support shaft 120, and an attachment portion 122 that bulges out from the outer circumferential surface of the shaft body 121 and that is fixed to the valve body 110.

The shaft body 121 is inserted into the shaft hole 106 and the hole 107 of the pipe 101 and is pivotally supported by the pipe 101 rotatably. Inside the pipe 101 pivotally supporting the shaft body 121, a seal member 108 such as an O-ring is provided to block the inflow of gas from the through-hole 102.

The attachment portion 122, for example, forms an approximately semicircular shape in which a surface that faces the valve body 110 is formed into a flat shape, and contacts the upper surface of the valve body 110 in the plane direction. The attachment portion 122 is disposed to pass between the pair of outer projections 112 (two cut-outs 113). A screw hole 123 through which the above-described screw can be screwed is provided at a predetermined position on the lower surface of the attachment portion 122.

The valve body operating section 130 is attached to the projection 105 and supports one end of the support shaft 120. Inside the valve body operating section 130, a drive source such as a motor and a transmission mechanism that transmits a drive force of the drive source to the support shaft are accommodated (both are not illustrated). The valve body operating section 130 is connected to the control device 90 via a driver, which is not illustrated, and rotates the support shaft based on the rotation angle instructed from the control device 90.

The pressure adjusting valve 100 changes the opening degree of the flow path of the exhaust path 51 by the rotation angle (a tilt) of the valve body 110 operated by the valve body operating section 130. The pressure adjusting valve 100 adjusts the flow rate of gas flowing through the flow path by changing the opening degree of the flow path of the exhaust path 51. This adjusts the pressure in the processing chamber 10 communicating with the exhaust path 51.

The pressure adjusting valve 100 according to the present embodiment includes a purge gas discharge mechanism 140 that discharges a purge gas from the valve body 110. The purge gas discharge mechanism 140 includes a pipe side flow path 141 provided in the pipe 101, a support shaft side flow path 142 provided in the support shaft 120, a valve body side flow path 143 provided in the valve body 110, and a gas diffusion section 144 provided in each outer projection 112 of the valve body 110. The purge gas discharge mechanism 140 is connected to a purge gas supply 150 installed outside the pressure adjusting valve 100, and a purge gas is supplied from the purge gas supply 150. The purge gas discharged by the purge gas discharge mechanism 140 is not particularly limited, but an inert gas such as an $N_2$ gas, an Ar gas or a $CO_2$ gas may be applied.

The purge gas supply 150 has an external supply path 151 through which the purge gas flows, and also includes a purge gas source 152, a flow rate adjuster 153 such as a mass flow controller, and an opening/closing valve 154 in order from the upstream side to the downstream side of the external supply path 151. The purge gas supply 150 switches the flow and stop of the purge gas and adjusts the flow rate of the purge gas by the control device 90 controlling the flow rate adjuster 153 and the opening/closing valve 154. The purge gas supply 150 may share the purge gas source, part of the path, and the like with the gas supply 40 of the semiconductor manufacturing apparatus 1.

The pipe side flow path 141 of the purge gas discharge mechanism 140 extends in the direction perpendicular to the axis of the support shaft 120 in the projection 105 (or the pipe 101 itself to which the projection 105 is connected). One end of the pipe side flow path 141 is connected to the external supply path 151 of the purge gas supply 150 through a connector, which is not illustrated.

The other end of the pipe side flow path 141 is connected to the support shaft side flow path 142 through a communication bearing 145 provided in the projection 105. The communication bearing 145 maintains the communication between the pipe side flow path 141 and the support shaft side flow path 142 without inhibiting the rotation of the support shaft 120. For example, the communication bearing 145 has a groove, around the outer circumferential surface of the support shaft 120, that communicates with the pipe side flow path 141, and a communication port 142a of the support shaft side flow path 142 is caused to face the groove for any angle which the support shaft 120 faces. Additionally, the seal member 108 that seals the support shaft 120 in the pipe 101 is installed between the valve body operating section 130 and the communication bearing 145 to prevent the purge gas from leaking from the pipe 101.

The support shaft side flow path 142 extends in a straight line along the axis center of the support shaft 120 inside the support shaft 120. One end of the support shaft side flow path 142 communicates with the communication port 142a formed on the outer circumferential surface of the support shaft 120 (see FIG. 2B). The other end of the support shaft side flow path 142 is bent with respect to the axis center of the support shaft 120 to communicate with a communication port 142b formed on the lower surface of the center of the attachment portion 122 (see FIG. 3). The communication port 142b is disposed at the center of the upper surface of the valve body 110 with the support shaft 120 being fixed to the valve body 110. Here, the support shaft side flow path 142 is not necessarily provided in the support shaft 120, but may be provided in a pipe that is continuously provided on the outer circumferential surface of the support shaft 120.

Figure 4A:
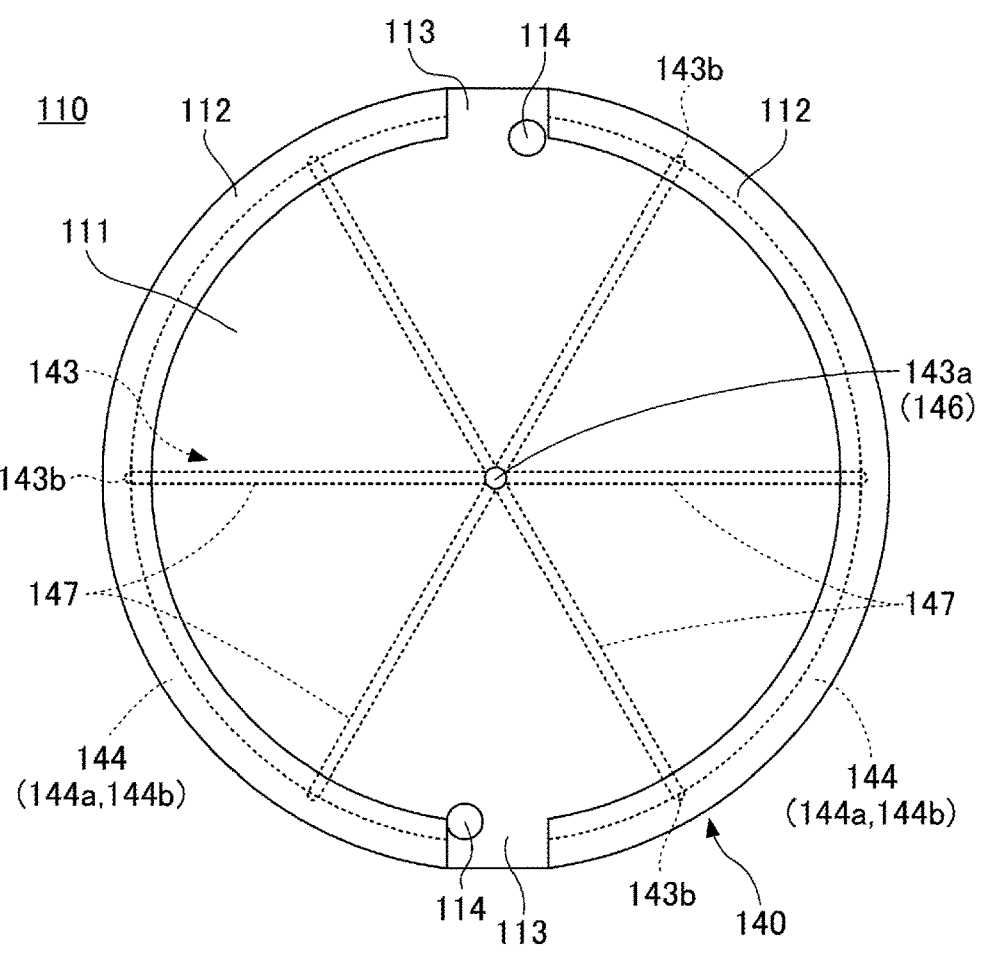
FIG. 4A is a plan view illustrating a valve body side flow path of the valve body.
Figure 4B:
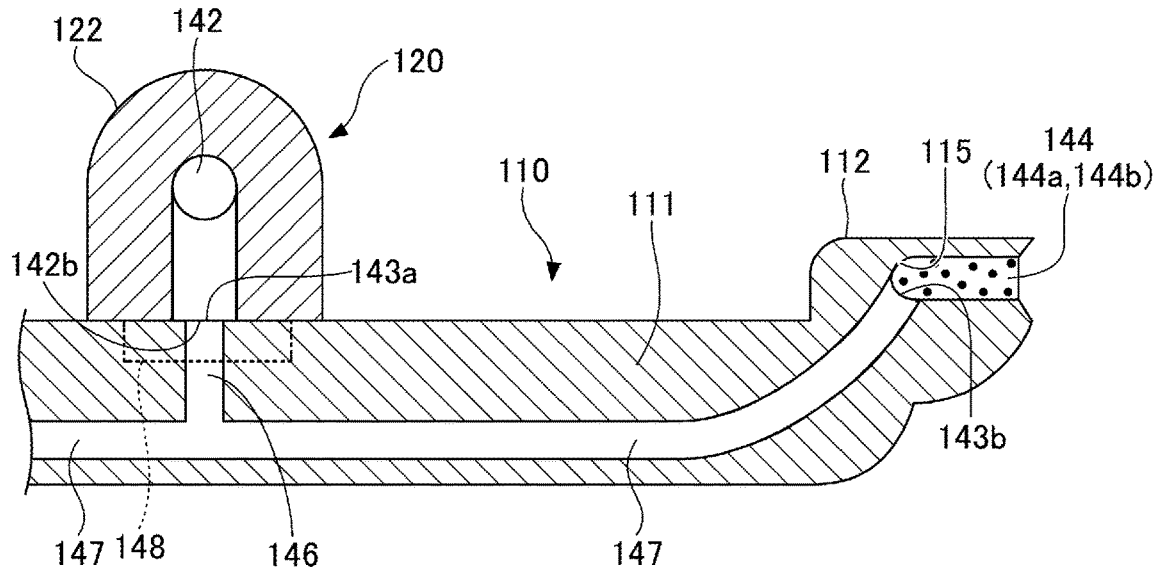
FIG. 4B is an enlarged cross-sectional view illustrating a state in which the valve body is attached to the support shaft.

As illustrated in FIG. 4A and FIG. 4B, the valve body side flow path 143 has an inlet 143a at the center of the upper surface of the valve body 110 and includes a common path 146 that extends for a short distance from the inlet 143a to the lower side in the thickness direction. Here, the inlet 143a may be at a position slightly shifted from the center of the valve body 110 (at an approximate center), and the "center" in the present disclosure includes an approximate center. Additionally, the valve body 110 and the support shaft 120 may include a positioning structure 148 (see the dotted line in FIG. 4B) to communicate the inlet 143a of the valve body 110 with the communication port 142b of the support shaft 120. For example, the positioning structure 148 may have an engaging structure of a recess provided in one of the valve body 110 and the support shaft 120 and a projection provided in the other.

The valve body side flow path 143 branches from the lower end of the common path 146 into multiple (six in the example illustrated in the drawing) branch paths 147. Here, the number of the branch paths 147 of the purge gas discharge mechanism 140 is not particularly limited and may be set to an appropriate number in consideration of the shape of the valve body 110 and the like.

The branch paths 147 radially extend outward in the radial direction of the valve body 110 from the common path 146 (the inlet 143a) at the center of the valve body 110. On the outer periphery of the base 111, the branch paths 147 are curved obliquely upward to reach the pair of outer projections 112 continuous with the upper surface of the base 111. The branch paths 147 respectively communicate with outlets 143b provided in the pair of outer projections 112.

Each outer projection 112 has an arrangement groove 115 in which the gas diffusion section 144 is arranged. The arrangement groove 115 continues over the entire outer edge of the outer projection 112 and has an opening outward in the radial direction of the outer projection 112 and has an appropriate depth from the opening to the inside of the outer projection 112 in the radial direction. The outlet 143b of each branch path 147 communicates with the bottom of the arrangement groove 115.

The gas diffusion section 144 is arranged in the arrangement groove 115 to diffuse the purge gas supplied from each branch path 147 through the outlet 143b. As the gas diffusion section 144, for example, a porous body 144a having irregular and numerous pores through which gas can pass can be applied. This causes the purge gas supplied from each branch path 147 to move along the circumferential direction of the porous body 144a (the arrangement groove 115) while the purge gas passes through the porous body 144a and to be discharged evenly from the outer circumferential surface of the porous body 144a.

Here, the gas diffusion section 144 is not limited to the application of the porous body 144a, and various configurations can be adopted. For example, a lattice structure 144b in which multiple lattices in branches are cyclically arranged may be applied to the gas diffusion section 144. By applying the lattice structure 144b as described, the gas diffusion section 144 can reproduce a gas diffusion function in each valve body 110. Additionally, for example, the gas diffusion section 144 may have a shower structure including a path extending in the circumferential direction of the outer projection 112 instead of the arrangement groove 115 and multiple discharge ports that are provided on the outer circumferential surface of the outer projection 112 and that communicate with the path.

The valve body 110 having the above-described purge gas discharge mechanism 140 can be manufactured by using a 3D printer, which is not illustrated. By the manufacturing using a 3D printer, even a configuration with the valve body side flow path 143 (the common path 146 and the branch paths 147) can be formed into a desired shape without using a mold to form the valve body side flow path 143. Additionally, by using a 3D printer, the gas diffusion section 144 (for example, the porous body 144a and the lattice structure 144b) can be formed continuously with the formation of the valve body 110, thereby simplifying the manufacturing process.

[Operations of the Semiconductor Manufacturing Apparatus 1 and the Pressure Adjusting Valve 100]

The pressure adjusting valve 100 and the semiconductor manufacturing apparatus 1 according to the present embodiment are configured as described above basically, and the operations thereof will be described below.

As illustrated in FIG. 1, the semiconductor manufacturing apparatus 1 opens the gate valve 12 with the susceptor 20 being lowered to the transfer position, and carries the substrate W in the processing chamber 10 through the carry-in/out port 11 with the transfer arm (which is not illustrated). Then, the substrate W is supported by the support pins 27b in the processing chamber 10, the support pins 27*b* are lowered after the transfer arm is retracted, and the substrate W is mounted on the susceptor 20. Subsequently, the semiconductor manufacturing apparatus 1 raises the susceptor 20 to the processing position.

Subsequently, the semiconductor manufacturing apparatus 1 decompresses the inside of the processing chamber 10 to a predetermined pressure by suctioning the gas in the processing chamber 10 through the exhaust section 50. After the decompression, the semiconductor manufacturing apparatus 1 forms a TiN film on the substrate W by the ALD process in which the processing gases of the raw gas (TiCl$_4$) and the reducing gas (NH$_3$) are supplied. For example, the semiconductor manufacturing apparatus 1 alternately repeats a process of supplying the raw gas and a process of supplying the reducing gas to promote the reaction of the raw gas and the reducing gas in the processing chamber 10 and form the TiN film.

In the film deposition process, the pressure adjusting valve 100 in the exhaust section 50 adjusts the opening degree of the flow path in the exhaust path 51 (the pipe 101) under the control of the control device 90. This allows the semiconductor manufacturing apparatus 1 to appropriately maintain the inside of the processing chamber 10 at a predetermined pressure.

Figure 5A:
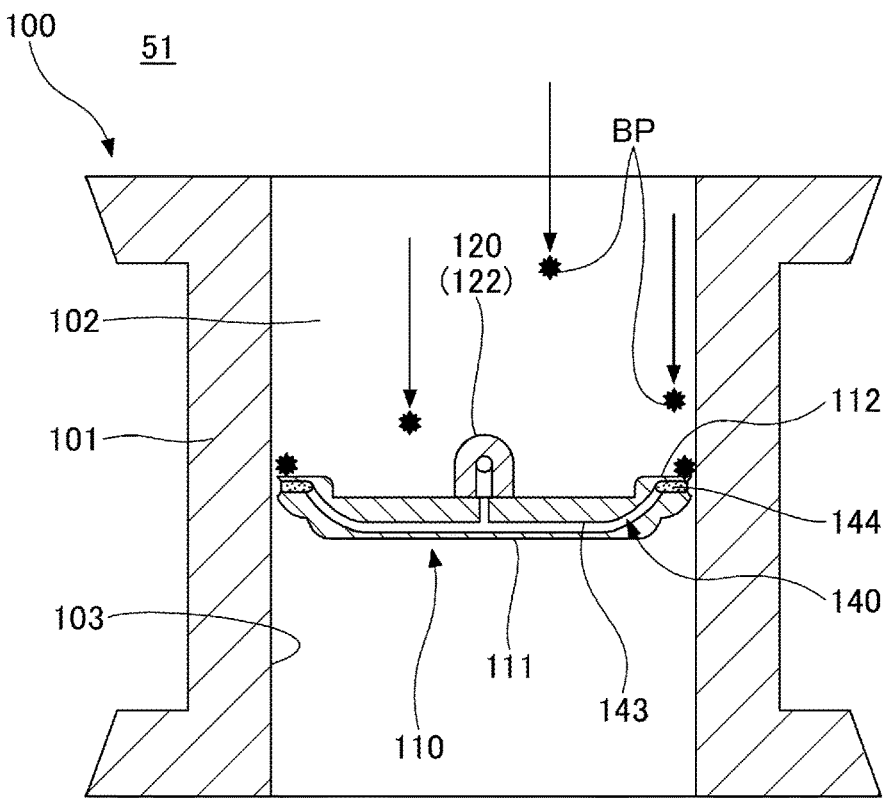
FIG. 5A is a sectional side view illustrating the deposition of by-products.

Additionally, in the film deposition process, byproducts that do not contribute to film formation are generated by the supply of multiple types of gases in the processing chamber 10. The exhaust section 50 suctions the byproducts by suctioning the gas. This causes the byproducts moved to the pressure adjusting valve 100 through the exhaust path 51 to be deposited on the pressure adjusting valve 100, as illustrated in FIG. 5A. Particularly, because the pressure adjusting valve 100 is arranged so that the pressure adjusting valve 100 can block the through-hole 102 of the pipe 101, the byproducts are easily deposited, and it is difficult to remove the byproducts on the pressure adjusting valve 100 only by adjusting the temperature of the exhaust path 51 and the like. The deposition of the byproducts between the outermost edge of the valve body 110 and the inner circumferential surface 103 of the pipe 101 may influence the operation of the valve body 110. For example, when the semiconductor manufacturing apparatus 1 is operated for a long period of time, the valve body 110 and the pipe 101 may be firmly fixed due to the deposition of many byproducts.

Figure 5B:
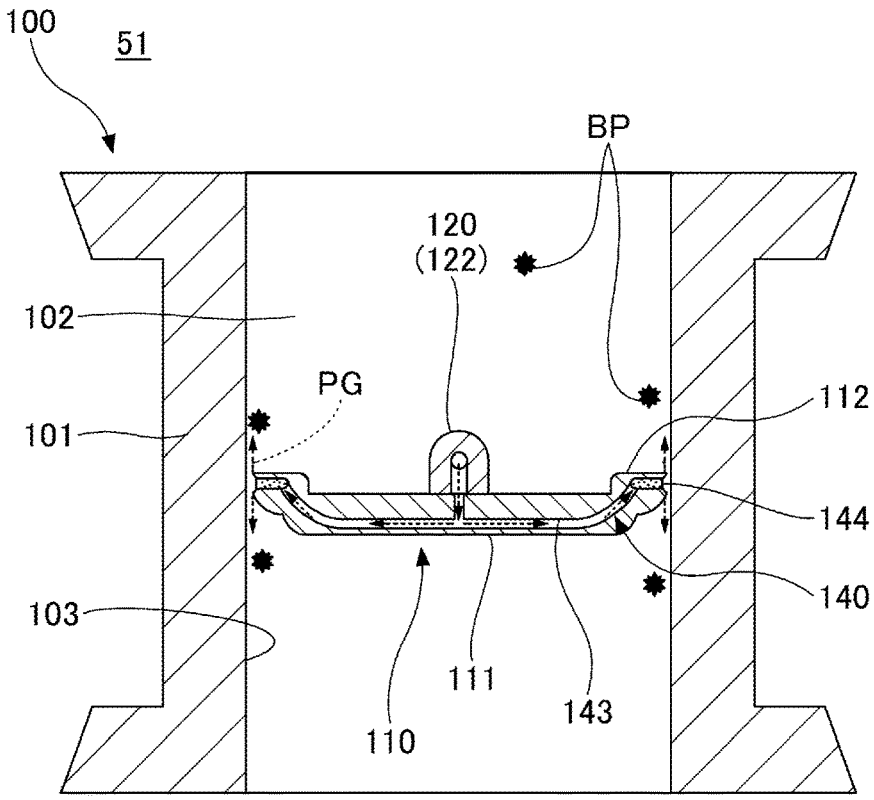
FIG. 5B is a sectional side view illustrating an action caused by discharge of a purge gas.

As illustrated in FIG. 5B, the purge gas discharge mechanism 140 of the pressure adjusting valve 100 discharges the purge gas from the respective outer projections 112, which are the outer periphery of the valve body 110, toward the side of the valve body 110 (the outside in the radial direction, and the horizontal direction). This allows the purge gas discharged from the valve body 110 to suppress the deposition of byproducts on the outer periphery of the valve body 110. The byproducts repelled from the valve body 110 by the purge gas are smoothly exhausted to the dispose section 53 due to the suction of the vacuum pump 52.

Even if the byproducts are deposited between the valve body 110 and the pipe 101, the influence of the by-products on the operation of the valve body 110 can be avoided by blowing off the byproducts by discharging the purge gas. Particularly, because the purge gas discharge mechanism 140 discharges the purge gas over the substantially entire circumference of the outermost edge of the valve body 110 in the circumferential direction by the gas diffusion section 144, the byproducts can be removed with certainty regardless of where the byproducts are deposited in the outermost edge. Here, the valve body side flow path 143 of the valve body 110 may extend to have a dedicated branch path 147 so as to cause the purge gas to blow toward an area where the byproducts are particularly likely to be deposited (for example, around the support shaft 120).

The semiconductor manufacturing apparatus 1 may constantly continue to discharge the purge gas from the purge gas discharge mechanism 140 during performing the film deposition process, or may be configured to discharge the purge gas only when the gases, from which the byproducts are generated, are supplied. This can suppress the supply amount of the purge gas. Additionally, the semiconductor manufacturing apparatus 1 may not only continuously discharge the purge gas from the valve body 110, but also intermittently discharge the purge gas. Alternatively, the semiconductor manufacturing apparatus 1 may be configured to discharge the purge gas for a predetermined period of time in a termination process after the film deposition process. With this configuration, the operation can be stopped after removing the byproducts deposited on the valve body 110.

Here, the pressure adjusting valve 100 according to the present disclosure is not limited to the above-described embodiment, and various modifications can be made. For example, the valve body 110 may include only the base 111 without the pair of outer projections 112. In this case, the branch paths 147 of the valve body side flow path 143 may be configured to extend in the base 111 in straight lines along the radial direction to reach the outer edge of the base 111.

In the following, modified embodiments of the pressure adjusting valve 100 will be described with examples.

First Modified Embodiment

Figure 6:
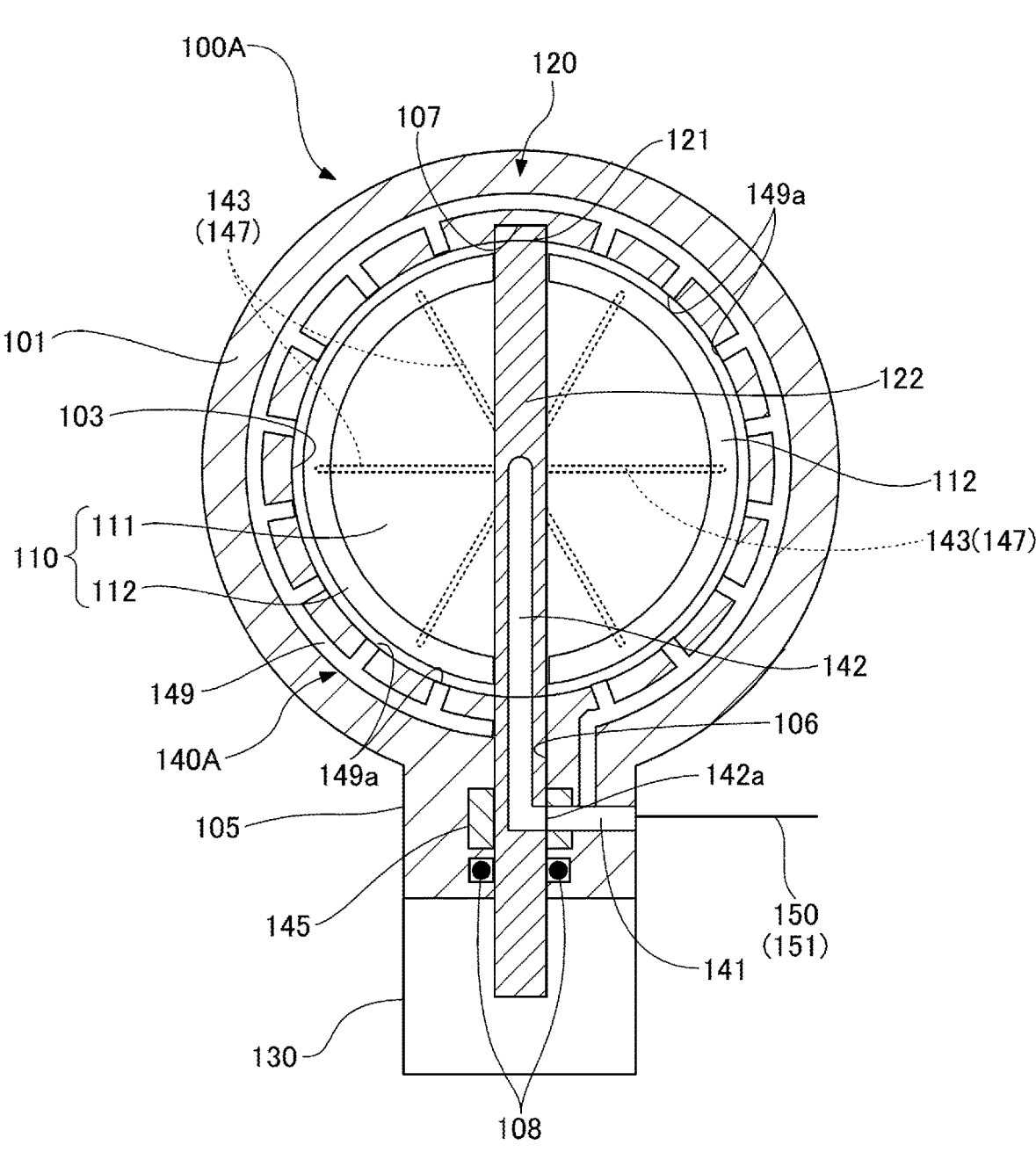
FIG. 6 is a sectional plan view schematically illustrating a pressure adjusting valve according to a first modified embodiment.

A pressure adjusting valve 100A according to a first modified embodiment illustrated in FIG. 6 includes a purge gas discharge mechanism 140A that discharges the purge gas from the inner circumferential surface 103 of the pipe 101. The purge gas discharge mechanism 140A has a pipe discharge flow path 149 that communicates with the pipe side flow path 141 in the pipe 101 and that extends along the circumferential direction of the pipe 101. Additionally, in the inner circumferential surface 103 of the pipe 101, multiple discharge ports 149*a* communicating with the pipe discharge flow path 149 are provided along the pipe discharge flow path 149 at substantially the same height position as the valve body 110.

The pipe discharge flow path 149 and the discharge ports 149*a* formed as described above discharge the purge gas supplied from the purge gas supply 150 from the inner circumferential surface 103 toward the valve body 110, so that the deposition of the byproducts to the valve body 110 can be suppressed. Additionally, the purge gas is discharged from the valve body 110 as well, so that the deposition of the byproducts can be suppressed with more certainty.

Second Modified Embodiment

Figure 7A:
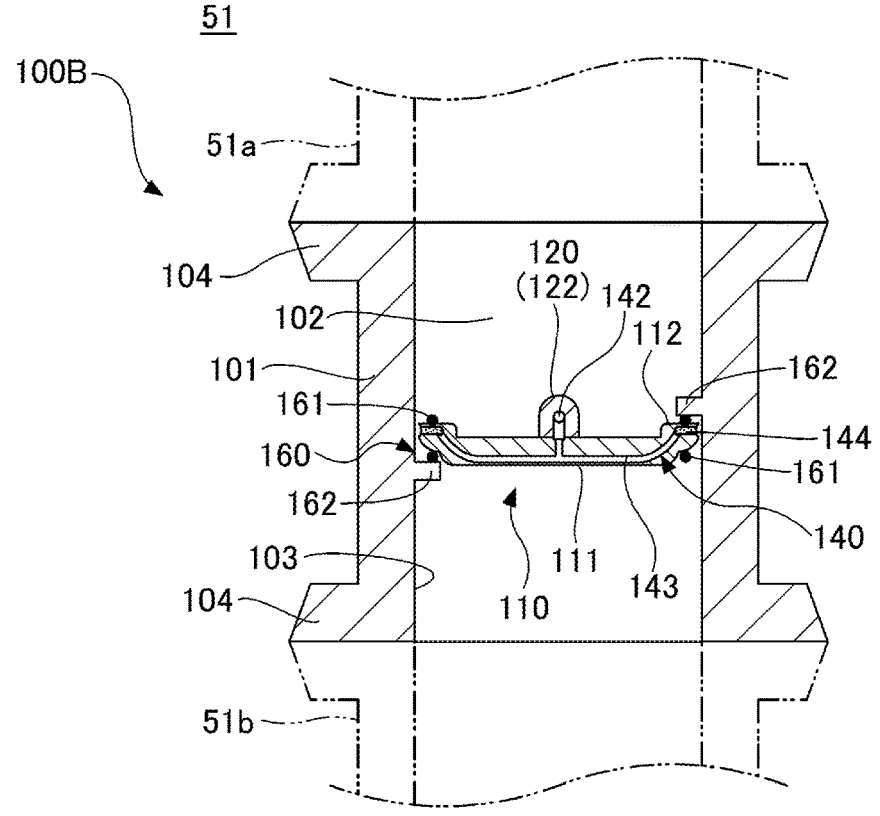
FIG. 7A is a sectional side view schematically illustrating a pressure adjusting valve according to a second modified embodiment.
Figure 7B:
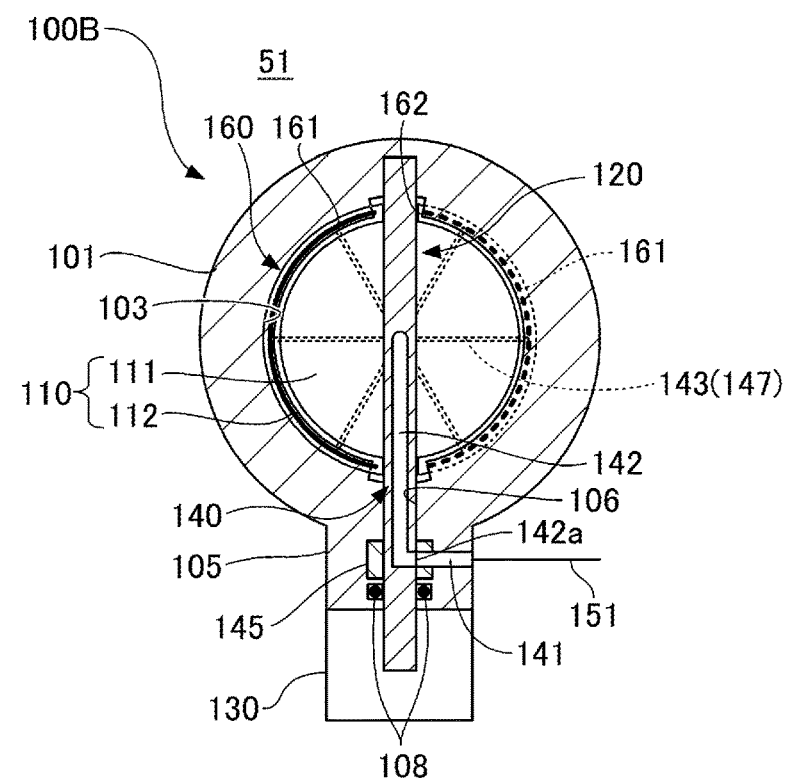
FIG. 7B is a sectional plan view schematically illustrating the pressure adjusting valve according to the second modified embodiment.

A pressure adjusting valve 100B according to a second modified embodiment illustrated in FIG. 7A and FIG. 7B improves the sealing performance of the valve body 110 by a seal mechanism 160 in order to reduce the conductance of the exhaust gas. Specifically, the seal mechanism 160 includes seal members 161 such as O-rings at the outer projections 112, that is, at the outer periphery of the upper surface (the primary side surface) and the lower surface (the secondary side surface) of the valve body 110, respectively. The seal member 161 circles annularly around the outer periphery of the valve body 110.

With respect to the above, the pipe 101 includes a pair of inner flanges 162 projecting inward on the inner circumferential surface 103. Each of the pair of inner flanges 162 forms an arc shape extending along the circumferential direction of the valve body 110 except for the support shaft 120. One of the pair of inner flanges 162 is formed on the upper side from the arrangement position of the valve body 110 (at a primary side position) in order to contact the seal member 161 on the upper surface of the valve body 110. The other of the pair of inner flanges 162 is formed on the lower side from the arrangement position of the valve body 110 (at a secondary side position) in order to contact the seal member 161 on the lower surface of the valve body 110. Here, the pressure adjusting valve 100B may include the seal member 161 on the inner flange 162, not on the valve body 110.

The pressure adjusting valve 100B configured as described above can reduce the clearance of the flow path as much as possible with the valve body 110 blocking the flow path of the exhaust path 51 (the through-hole 102 of the pipe 101). Therefore, the exhaust of the gas from the processing chamber 10 can be blocked with more certainty.

Also in the pressure adjusting valve 100B, the purge gas is discharged by the purge gas discharge mechanism 140 and is guided to the seal member, so that the deposition of the byproducts can be suppressed. That is, the valve body side flow path 143 can guide the purge gas between the seal member 161 and the inner flange 162 by discharging the purge gas from the outermost edge of the valve body 110 in the radial direction. Alternatively, the valve body side flow path 143 may be configured to suppress the deposition of the byproducts to the seal member 161 by discharging the purge gas from the inner side of the seal member 161 toward the seal member 161.

Third Modified Embodiment

Figure 8:
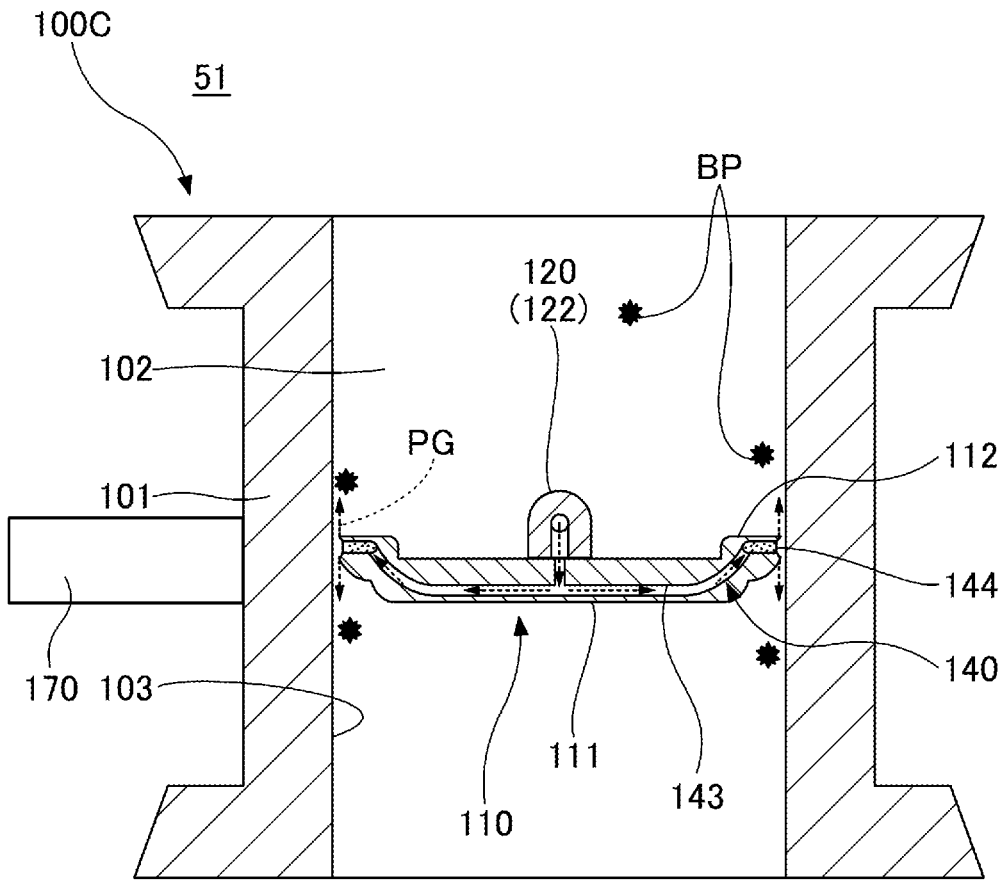
FIG. 8 is a sectional side view schematically illustrating a pressure adjusting valve according to a third modified embodiment.

A pressure adjusting valve 100C according to a third modified embodiment illustrated in FIG. 8 differs from the pressure adjusting valves 100, 100A, and 100B described above in that a vibrator 170 that vibrates the pipe 101 is included outside the pipe 101. The vibrator 170 is connected to the control device 90 and vibrates the pipe 101 at an appropriate timing under the control of the control device 90. The pressure adjusting valve 100C can further reduce the deposition of the byproducts to the pipe 101 around the valve body 110 by vibrating the pipe 101, in addition to discharging the purge gas from the valve body 110 by the purge gas discharge mechanism 140.

The technical ideas and effects of the present disclosure described in the above embodiments will be described below.

A first aspect of the present invention is the pressure adjusting valves 100 and 100A to 100C, each of which includes the pipe 101, the valve body 110 located inside the pipe 101, and the support shaft 120 that rotatably supports the valve body 110, and is configured to adjust the pressure by rotating the valve body 110. The valve body 110 has, inside the valve body 110, the valve body side flow path 143 through which the purge gas can flow, and has multiple outlets 143b that communicates with the valve body side flow path 143 at the outer periphery of the valve body 110. The support shaft 120 has the support shaft side flow path 142 for introducing the purge gas into the valve body side flow path 143.

According to the description above, the pressure adjusting valves 100 and 100A to 100C can suppress the deposition of objects (byproducts) to the valve body 110 and the pipe 101 around the valve body 110 by discharging the purge gas from the valve body 110. This increases the durability of the pressure adjusting valves 100 and 100A to 100C and enables the valve body 110 to operate continuously and stably.

Additionally, the valve body 110 has, in the center of the valve body 110, the inlet 143a that communicates with the support shaft side flow path 142, and the valve body side flow path 143 has multiple branch paths 147 that radially extends from the inlet 143a toward each of the multiple outlets 143b. This allows the valve body 110 to evenly distribute the purge gas through each branch path 147, and to discharge the purge gas from the entire outer periphery of the valve body 110.

Additionally, the valve body 110 has the outer edge (the outer projection 112) that has multiple outlets 143b and that discharges the purge gas toward the outside of the valve body 110 in the radial direction. With this configuration, the pressure adjusting valves 100 and 100A to 100C can prevent the operation of the valve body 110 from being inhibited due to the deposition of the byproducts between the valve body 110 and the pipe 101.

Additionally, the valve body 110 includes the gas diffusion section 144 that extends in the circumferential direction of the valve body 110 and that covers the multiple outlets 143b, and the gas diffusion section 144 diffuses the purge gas discharged from the multiple outlets 143b in the circumferential direction of the valve body 110 and causes purge gas to flow out toward the outside of the valve body 110. This allows the valve body 110 to further diffuse the purge gas along the circumferential direction of the valve body 110 and discharge the purge gas to the outside of the valve body 110.

Additionally, the gas diffusion section 144 is the porous body 144a having multiple pores. By applying the porous body 144a in such a way, the pressure adjusting valves 100 and 100A to 100C can easily diffuse the purge gas.

Alternatively, the gas diffusion section 144 may be the lattice structure 144b in which lattices are cyclically arranged. By applying the lattice structure 144b in such a way, the pressure adjusting valves 100 and 100A to 100C can improve the reproducibility of the diffusion of the purge gas.

Additionally, the pipe 101 has the pipe discharge flow path 149 that extends around the position where the valve body 110 is arranged, and multiple discharge ports 149a that communicate with the pipe discharge flow path 149 for discharging the purge gas toward the valve body 110. This allows the pressure adjusting valve 100C to suppress the deposition of byproducts to the pipe 101 around the valve body 110 with more certainty.

Additionally, the pipe 101 includes multiple inner flanges 162 projecting inward from the inner surface in the radial direction, and the multiple inner flanges 162 seal the valve body 110 on the primary side and the secondary side by being in contact with each of the primary side surface of the valve body 110 and the secondary side surface of the valve body 110. This allows the pressure adjusting valve 100B to suppress the deposition of byproducts and to increase the gas blocking capacity in the pipe 101.

Additionally, the pipe 101 includes the vibrator 170 that vibrates the pipe 101. This allows the pressure adjusting valve 100C to peel off the byproducts attached to the pipe 101 by the vibration of the vibrator 170, and suppress the deposition of the byproducts on the pipe 101 side.

A second aspect of the present disclosure is the semiconductor manufacturing apparatus 1 including the processing chamber 10, the gas supply 40 configured to supply the processing gas to the processing chamber 10, and the exhaust path 51 configured to discharge the gas from the processing chamber 10. The exhaust path 51 includes the pipe 101, the valve body 110 arranged inside the pipe 101, and the support shaft 120 configured to rotatably support the valve body 110, and includes one of the pressure adjusting valves 100 and 100A to 100C that are configured to adjust the pressure by rotating the valve body 110. The valve body 110 has, inside the valve body 110, the valve body side flow path 143 through which the purge gas can flow, and has multiple outlets 143b that communicate with the valve body side flow path 143 at the outer periphery of the valve body 110. The support shaft 120 has the support shaft side flow path 142 for introducing the purge gas into the valve body side flow path 143.

The pressure adjusting valves 100 and 100A to 100C and the semiconductor manufacturing apparatus 1 according to the disclosed embodiment are examples in all respects and are not restrictive. Modifications and improvement can be made to the above described embodiment in various forms without departing from the scope and subject matter of the claims. With respect to the matters described in the above multiple embodiments, other configurations can be adopted to the extent that they are not inconsistent and can be combined to the extent that they are not inconsistent.

The semiconductor manufacturing apparatus 1 of the present disclosure is applicable to any type of apparatuses of an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, and a helicon wave plasma (HWP) apparatus.

According to one aspect, the deposition of byproducts to the pressure adjusting valve can be effectively suppressed.

What is claimed is:

1. A pressure adjusting valve comprising:
a pipe;
a valve body arranged inside the pipe; and
a support shaft configured to rotatably support the valve body,
wherein the pressure adjusting valve is configured to adjust pressure by rotating the valve body,
wherein the valve body has, inside the valve body, a valve body side flow path through which a purge gas can flow, and has a plurality of outlets that communicate with the valve body side flow path at an outer periphery of the valve body,
wherein the support shaft has a support shaft side flow path for introducing the purge gas into the valve body side flow path, and
wherein the valve body side flow path has a plurality of branch paths that respectively communicate with the plurality of outlets.

2. The pressure adjusting valve as claimed in claim 1, wherein the valve body has an inlet that communicates with the support shaft side flow path, the inlet being at a center of the valve body, and
wherein the plurality of branch paths that radially extend from the inlet to each of the plurality of outlets.

3. The pressure adjusting valve as claimed in claim 1, wherein the valve body has an outer edge that has the plurality of outlets and that discharges the purge gas toward an outside of the valve body in a radial direction.

4. The pressure adjusting valve as claimed in claim 1,
wherein the valve body includes a gas diffusion section that extends in a circumferential direction of the valve body and that covers the plurality of outlets, and
wherein the gas diffusion section is configured to diffuse the purge gas discharged from the plurality of outlets in the circumferential direction of the valve body and cause the purge gas to flow out to an outside of the valve body.

5. The pressure adjusting valve as claimed in claim 4, wherein the gas diffusion section is a porous body having a plurality of pores.

6. The pressure adjusting valve as claimed in claim 4, wherein the gas diffusion section is a lattice structure in which lattices are cyclically arranged.

7. The pressure adjusting valve as claimed in claim 1, wherein the pipe has a pipe discharge flow path and a plurality of discharge ports, the pipe discharge flow path extending around a position where the valve body is arranged, and the plurality of discharge ports communicating with the pipe discharge flow path for discharging the purge gas toward the valve body.

8. The pressure adjusting valve as claimed in claim 1,
wherein the pipe includes a plurality of inner flanges that project inward in a radial direction from an inner surface of the pipe, and
wherein the plurality of inner flanges seals the valve body on a primary side and a secondary side by being in contact with a primary side surface of the valve body and a secondary side surface of the valve body.

9. The pressure adjusting valve as claimed in claim 1, wherein the pipe includes a vibrator configured to vibrate the pipe.

10. A semiconductor manufacturing apparatus comprising:
a processing chamber;
a gas supply configured to supply a processing gas to the processing chamber; and
an exhaust path for exhausting a gas from the processing chamber,
wherein the exhaust path includes a pressure adjusting valve including:
a pipe;
a valve body arranged inside the pipe; and
a support shaft configured to rotatably support the valve body,
wherein the pressure adjusting valve is configured to adjust pressure by rotating the valve body,
wherein the valve body has, inside the valve body, a valve body side flow path through which a purge gas can flow, and has a plurality of outlets that communicate with the valve body side flow path at an outer periphery of the valve body,
wherein the support shaft has a support shaft side flow path for introducing the purge gas into the valve body side flow path, and
wherein the valve body side flow path has a plurality of branch paths that respectively communicate with the plurality of outlets.

* * * * *